United States Patent
Casper (10) Patent No.: US 7,884,317 B2
(45) Date of Patent: Feb. 8, 2011

(54) BASE LINE RESTORATION CIRCUIT

(75) Inventor: Ted J. Casper, West Bend, WI (US)

(73) Assignee: Leco Corporation, St. Joseph, MI (US)

( * ) Notice: Subject to any disclaimer, the term of this patent is extended or adjusted under 35 U.S.C. 154(b) by 338 days.

(21) Appl. No.: 11/961,539

(22) Filed: Dec. 20, 2007

(65) Prior Publication Data

US 2008/0156982 A1    Jul. 3, 2008

Related U.S. Application Data

(60) Provisional application No. 60/878,299, filed on Jan. 3, 2007.

(51) Int. Cl.
*B01D 59/44* (2006.01)
*H01J 49/00* (2006.01)

(52) U.S. Cl. .................. 250/281; 250/287

(58) Field of Classification Search .......... 250/281, 250/287, 300, 261, 262, 297, 283; 327/307; 330/9
See application file for complete search history.

(56) References Cited

U.S. PATENT DOCUMENTS

| | | | | |
|---|---|---|---|---|
| 3,639,741 | A * | 2/1972 | Carrick | 341/132 |
| 4,125,812 | A * | 11/1978 | Polonio | 327/307 |
| 4,322,687 | A * | 3/1982 | Dwarakanath et al. | 330/9 |
| 4,490,682 | A * | 12/1984 | Poulo | 330/9 |
| 4,599,573 | A * | 7/1986 | Senderowicz | 330/107 |
| 5,712,480 | A * | 1/1998 | Mason | 250/287 |
| 5,981,946 | A * | 11/1999 | Mason | 250/287 |
| 6,225,848 | B1 * | 5/2001 | Tilley et al. | 327/307 |
| 6,288,604 | B1 * | 9/2001 | Shih et al. | 330/9 |
| 6,756,924 | B2 * | 6/2004 | Lee et al. | 341/120 |
| 6,841,936 | B2 | 1/2005 | Keller et al. | |
| 6,903,344 | B2 | 6/2005 | Breeding et al. | |
| 6,982,413 | B2 * | 1/2006 | Knecht et al. | 250/281 |
| 2003/0128776 | A1 * | 7/2003 | Rawlins et al. | 375/319 |
| 2003/0155978 | A1 * | 8/2003 | Pehlke | 330/296 |
| 2005/0056779 | A1 * | 3/2005 | Chefetz et al. | 250/288 |
| 2005/0276358 | A1 * | 12/2005 | Pipilos | 375/345 |
| 2005/0279929 | A1 * | 12/2005 | Youngquist et al. | 250/288 |
| 2007/0063757 | A1 * | 3/2007 | Bouras | 327/307 |

(Continued)

OTHER PUBLICATIONS

ETP Electron Multipliers MagneTOF™ Detector Application Notes dated Sep. 13, 2006.

(Continued)

*Primary Examiner*—Robert Kim
*Assistant Examiner*—Brooke Purinton
(74) *Attorney, Agent, or Firm*—Price, Heneveld, Cooper, DeWitt & Litton, LLP (57) ABSTRACT

Circuits for correcting base line shift of the detector coupling circuit of a TOFMS provide gain and impedance characteristics that compensate for the AC coupling effect of the detector. In one circuit, base line correction is achieved by injecting a current equal to that which flows due to the buildup charge in the detectors AC coupling network. In another circuit, the current source drives an integrator which is coupled to the signal path to reduce the detector AC coupling effects. In another circuit, a low noise amplifier utilizes a feedback network that reduces the detector AC coupling effects. In yet another circuit, an operational amplifier is employed to reduce the detector AC coupling effects.

12 Claims, 10 Drawing Sheets

U.S. PATENT DOCUMENTS

| | | | |
|---|---|---|---|
| 2007/0096823 A1* | 5/2007 | Wang et al. | 330/285 |
| 2007/0124089 A1* | 5/2007 | Jochum et al. | 702/32 |
| 2007/0231207 A1* | 10/2007 | Mason | 422/67 |
| 2008/0024337 A1* | 1/2008 | Marsili et al. | 341/120 |

OTHER PUBLICATIONS

"A New Class of Robust Sub-nanosecond TOF Detectors with High Dynamic Range" by Dick Stresau, et al. and presented at the $54^{th}$ ASMS Conference in Seattle, Washington, 2006.

* cited by examiner

BASE LINE RESTORATION CIRCUIT

CROSS-REFERENCE TO RELATED APPLICATIONS

This application claims priority under 35 U.S.C. §119(e) on U.S. Provisional Application No. 60/878,299 entitled Base Line Restoration Circuit, filed on Jan. 3, 2007, by Ted J. Casper, the entire disclosure of which is incorporated herein by reference.

BACKGROUND OF THE INVENTION

The present invention relates to circuits that compensate for the base line offset caused by AC coupling of a detection system.

Ion detectors suitable for time-of-flight mass spectroscopy (TOFMS) have become available that allow the data collection system to be at a different potential than the ion detecting device. This allows the ion detector voltages to be optimized for sensitivity and resolution without requiring the output stage of the ion detector to be near ground potential. These detectors use a DC blocking capacitor to couple the electron current from the detector output to the data collection system. An example of this type of detector would be the ETP AF882123. This particular detector uses a 1000 pF high voltage capacitor to couple the detector output to the connector which feeds the data collection system. A second 1000 pF capacitor provides a return path for the current and is connected between the detectors output bias supply and ground. The value of this capacitance may be different for various detector models and manufacturers. In addition, the capacitance value will vary with applied detector bias voltages.

Although this method provides high frequency coupling, the lower frequency components are not transferred to the data collection system resulting in a base line shift this is dependant on output magnitude and duration. This issue has been recently acknowledge by ETP (a division of SGE Analytical Science Pty. Ltd.) in an Application note titled "ETP Electron Multiplies MagneTOF™ Detector Applications Notes Preliminary Version—13/9/06".

Typical ion detectors output current pulses that are Gaussian in shape. These pulses are defined by their peak amplitude and the width of the pulse at one half peak amplitude. This width is commonly referred to as Full Width Half Height (FWHH) in the scientific community. Typical output pulses from an ion detector can range from a FWHH of 400 pS to greater than 15 nS with amplitudes ranging from micro volts to hundreds of mili volts when measure at 50 Ohms. Historically, the last grid or plate in the detector was terminated into a ground referenced 50 Ohm system. The 50 Ohm system allows for easy connection from the detector to the data collection system using conventional coaxial cable.

DC coupling of a detector may not be possible due to high voltages present on the detection device. An example is an electron multiplier or micro channel plate used for the detection of ions or other charged particles. The AC coupling circuit creates an average offset in the base line that is equal to the average output current of the detector times the detectors output load resistance. In addition, detector pulses create instantaneous offsets that are dependent on the height and width of the pulses, thereby creating a base line that is peak dependant.

SUMMARY OF THE INVENTION

This invention compensates for such instantaneous base line shifts. The present invention provides methods and circuits for correcting base line shift by providing gain and impedance characteristics that compensate for the AC coupling effect of the detector. In one embodiment, the circuit achieves base line correction by injecting a current equal to that which flows due to the buildup charge in the detectors AC coupling network. In another embodiment, the current source drives an integrator which is coupled to the signal path to cancel or reduce the detector AC coupling effects. In yet another embodiment, a low noise amplifier stage utilizes a feedback network that cancels or reduces the detector AC coupling effects. In yet a further embodiment of the invention, an operational amplifier is employed which cancels or reduces the detector AC coupling effects.

In each of these embodiments, the base line restoration for a time-of-flight mass spectrometer is provided to correct for errors introduced by the AC coupling network of an ion detector.

These and other features, objects and advantages of the present invention will become apparent upon reading the following description thereof together with reference to the accompanying drawings.

DETAILED DESCRIPTION OF THE PREFERRED EMBODIMENT

Figure 1:
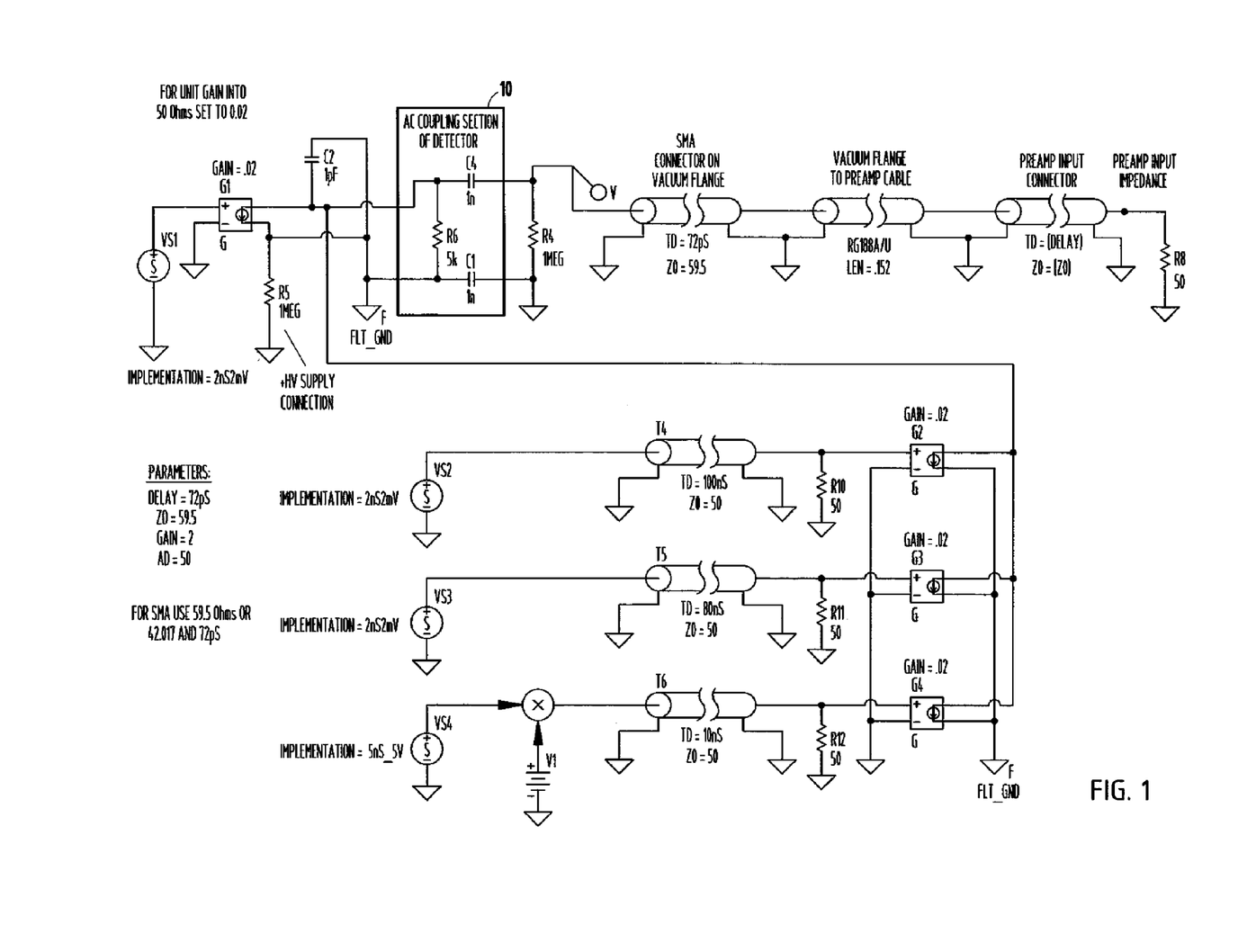

A computerized model of a typical AC coupling network (modeled in P-Spice) illustrates the effects of the detector AC coupling circuit. The model is shown in FIG. 1. The AC coupling section of the ETP detector is inside block 10. Actual detector output signals would be negative in polarity. Positive pulses were utilized in this simulation to simplify the discussion.

Piecewise Gaussian pulses were created that feed current sources ($G_1$-$G_4$) to simulate the current output of the detector. To obtain multiple pulses, current sources were summed. Four pulses were injected in the following sequence; 2 mV 2 nS FWHH (full width at half height), 500 mV 15 nS FWHH, 2 mV 2 nS FWHH, 2 mV 2 nS FWHH. The output voltage across R6 and R4 to ground was measured. With the +HV resistance at 1 MEG (simulating a filter) a DC shift occurs at R4. The magnitude of the shift is equal to 50/5050 of the voltage across R6 (the sum of the capacitor C1 and C4 voltages). The signal time delays are shown by T1-T6.

Figure 2:
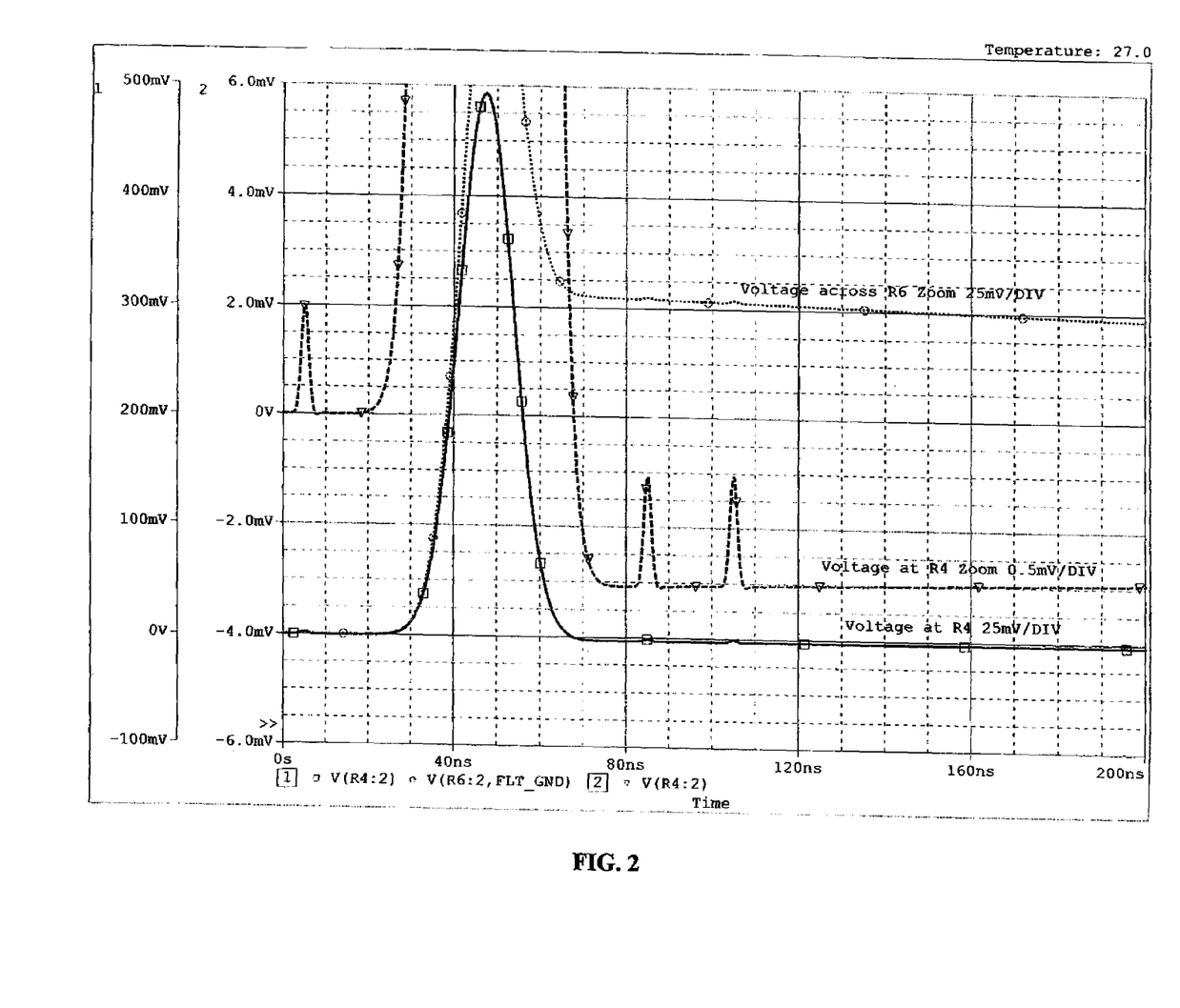

FIG. 2 shows the simulation results with R5=1 MEG. The instantaneous offset produced is equal to the integrated current from the detector times the reciprocal of the capacitance present. For instance, to produce a 0.5V signal peak requires 10 mA into 50 Ohms (the circuit load resistance). The integrated current of a Gaussian 10 mA 15 nS FWHH pulse is 159.9 pA-Seconds. The voltage across 500 pF of capacitance (C1 in series with C4) would be 319.8 mV which is close to the value calculated. This voltage is divided between R6 and the impedance across R4 (including R4). Since the load resistance is 50 Ohms, the DC offset across R4 created by the single 500 mV, 15 nS FWHH pulse would be 50/5050 time 319.8 mV or 3.16 mV. This offset will discharge at a time constant of the total R times C or in this case 5050 times 500 pF. For the offset to decay to within 500 uV, (¼ of a 2 mV signal) 4.66 uS of signal free time would have to occur. The average voltage across R6 will be equal to the Detector average output current times 5050 provided the current consists of pulses that occur at a rate more frequent than the time constant of the circuit. If R5 is reduced to near 0, (direct connection to +HV supply) C1 is no longer dominant in the circuit, and the offset for a given previous peak becomes smaller due to the increased time constant of 1 nF time 5050 Ohms versus the 1 nF/2 times 5050 ohms of the filtered +HV. The average R6 voltage will still be equal to the average Detector current times 5 k.

Figure 3:
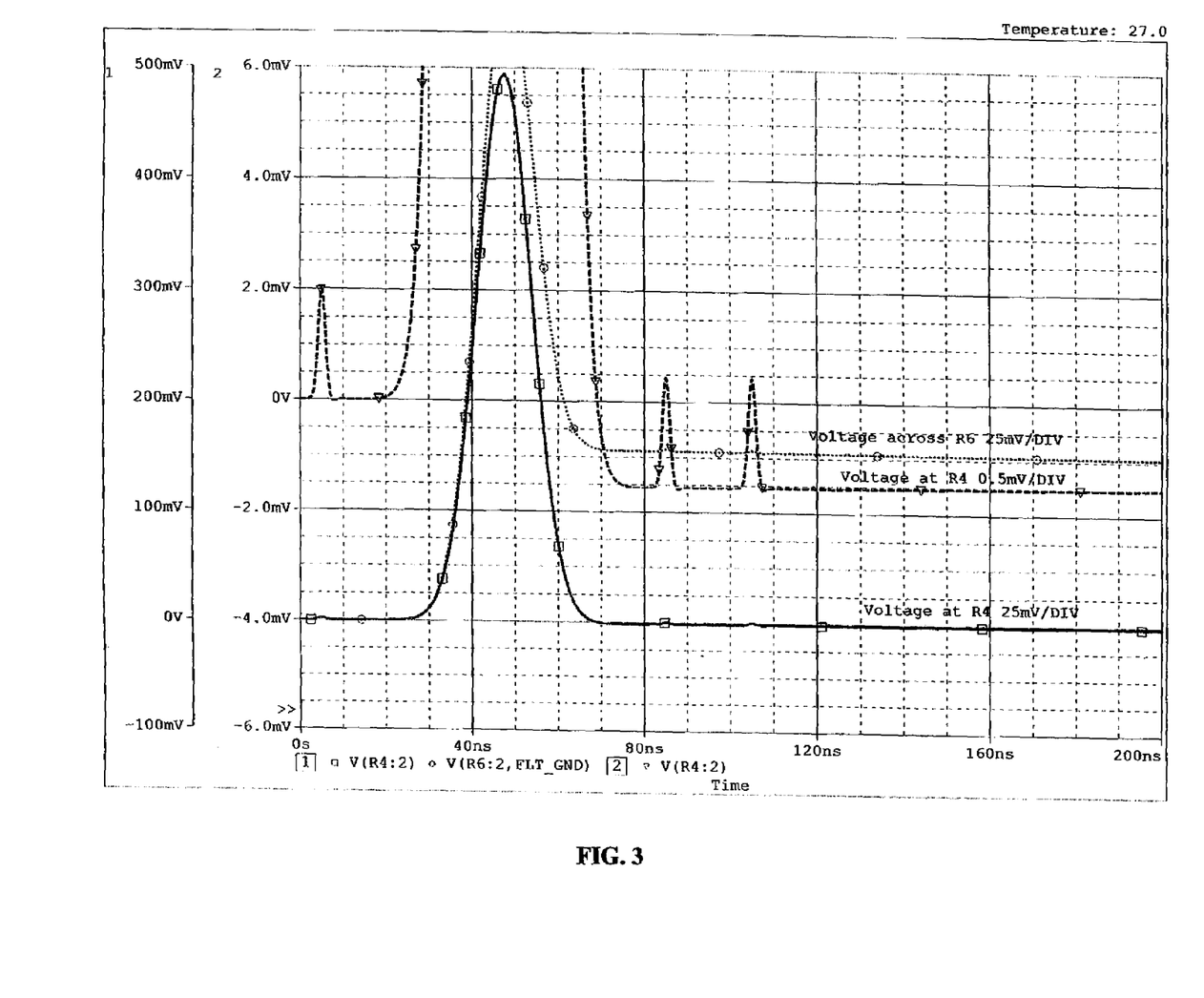

FIG. 3 shows simulation results with R5=0.01. Base line shift will be present for the ETP AF882123 Detector. The instantaneous shift will be peak dependant and will therefore vary by composition and concentration. Depending on the spectral components of a sample, the offsets could tend to mask trailing mass events by shifting them positive. As noted earlier, the computer model simulations used inverted currents than what the actual detector will produce.

These base line shifts can be corrected through many means, including variations to the methods discussed. Modifications of these methods or use of different circuits and/or components could be made without departing from the spirit or scope of this invention. The following are examples of circuits and their operation that can be used to correct for the base line shift effect.

EXAMPLE 1

Integrate and Inject Compensation Current

Figure 4:
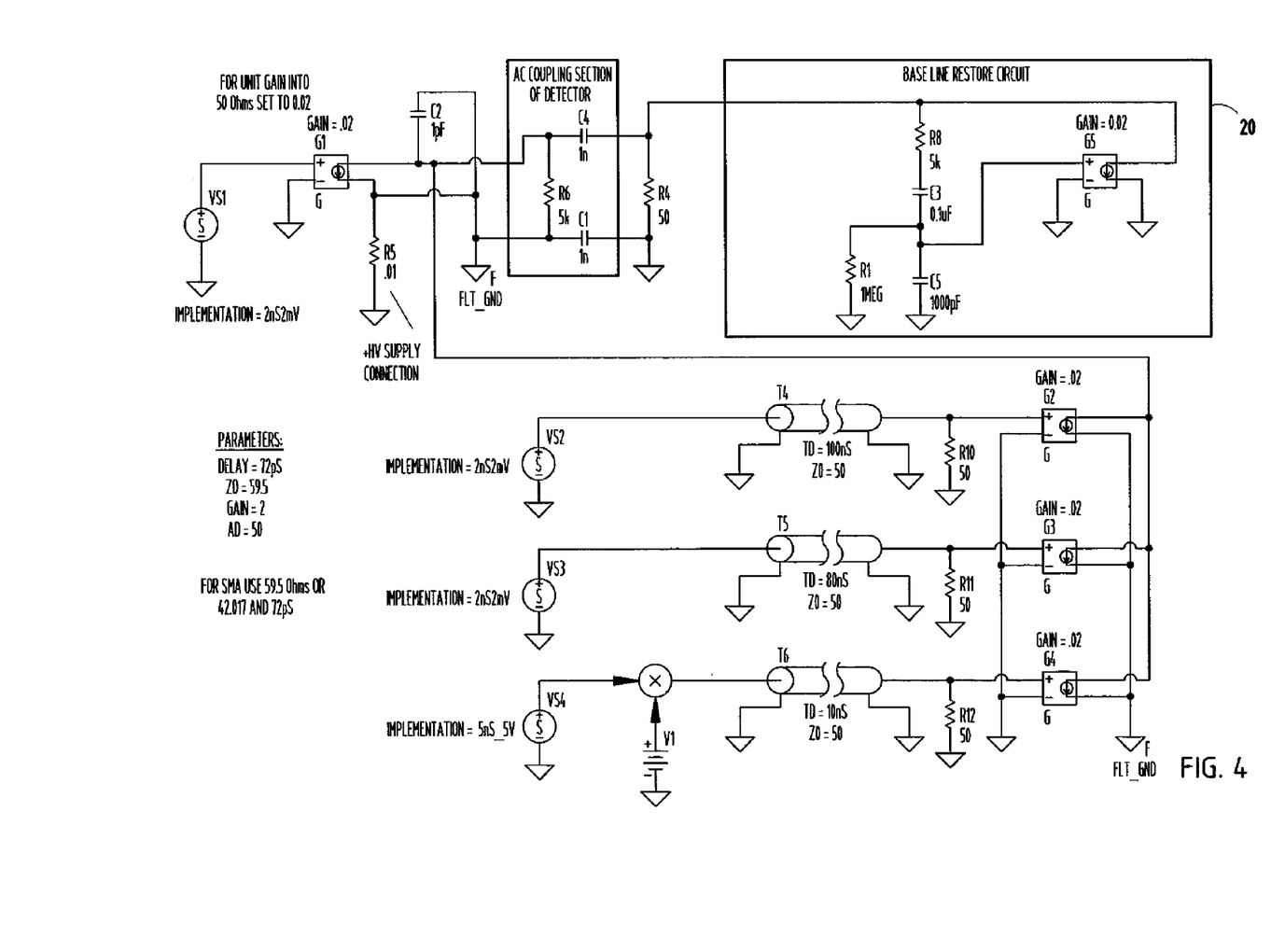

In one embodiment, the circuit of FIG. 4 achieves base line correction by injecting a current equal to that which flows due to the built up charge in the detector's AC coupling network of C1, C4 and R6. When the +HV supply is connected to a stiff supply (which is preferable in most cases), C1 is no longer a factor in the time constant. To mimic the response of R6 and C4, the base line restore circuit 20 of FIG. 4 employs a low pass filter R8 and C5 coupled in shunt with the termination resistance R4, the data systems input impedance. The data system could be the input to an analog to digital (A/D) converter or an amplifier stage. C3 is present to block DC current thus preventing run away of the compensation over time. The value of C3 is chosen to be much greater than C5. R1 provides a DC reference and has a resistance which is much greater than that of R8. The voltage measured on C5 is converted to a current by voltage controlled current source G5 and its output added to the current flow at the node of R4, C4 and R8. The preferred values of the circuit elements are shown on the circuit diagram of FIG. 4.

Figure 5:
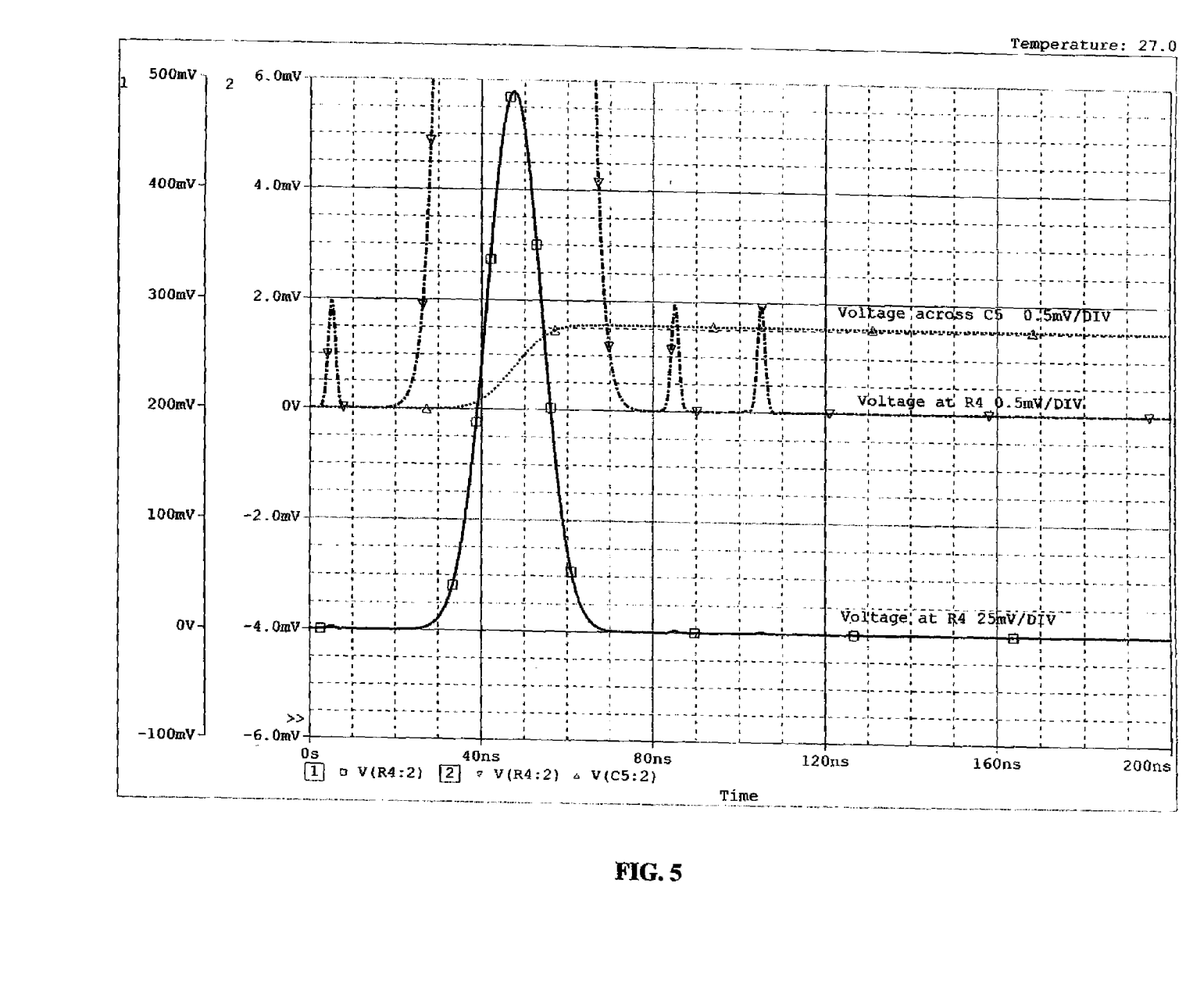

Since the voltage across C5 is near identical to the offset created across R4 due to AC coupling, G5 is adjusted to inject a current that offsets or cancels the AC coupling effect. FIG. 5 shows the results of the same stimulus used on FIG. 3.

FIG. 3 shows a base line drift of greater than 1.5 mV. With the base line restore circuit 20, however, the base line drift is reduced to near zero as shown in FIG. 5. Actual implementation of G5 could be accomplished by utilizing (for example) a transconductance amplifier like the OPA660, OPA860 or OPA615 from Texas Instruments (also for the current sources G1-G5 in all circuits). Transistors or operational amplifiers could also be utilized to create the required current source. This implementation has the draw back of adding wide band noise to the low level signals coming from the detector since the current source directly feeds the load resistance. Noise will be added up to the bandwidth of the amplifier which for the OPA660, OPA860, or OPA615 can reach over 400 MHz.

EXAMPLE 2

Current Driven Integrator Compensator

Figure 6:
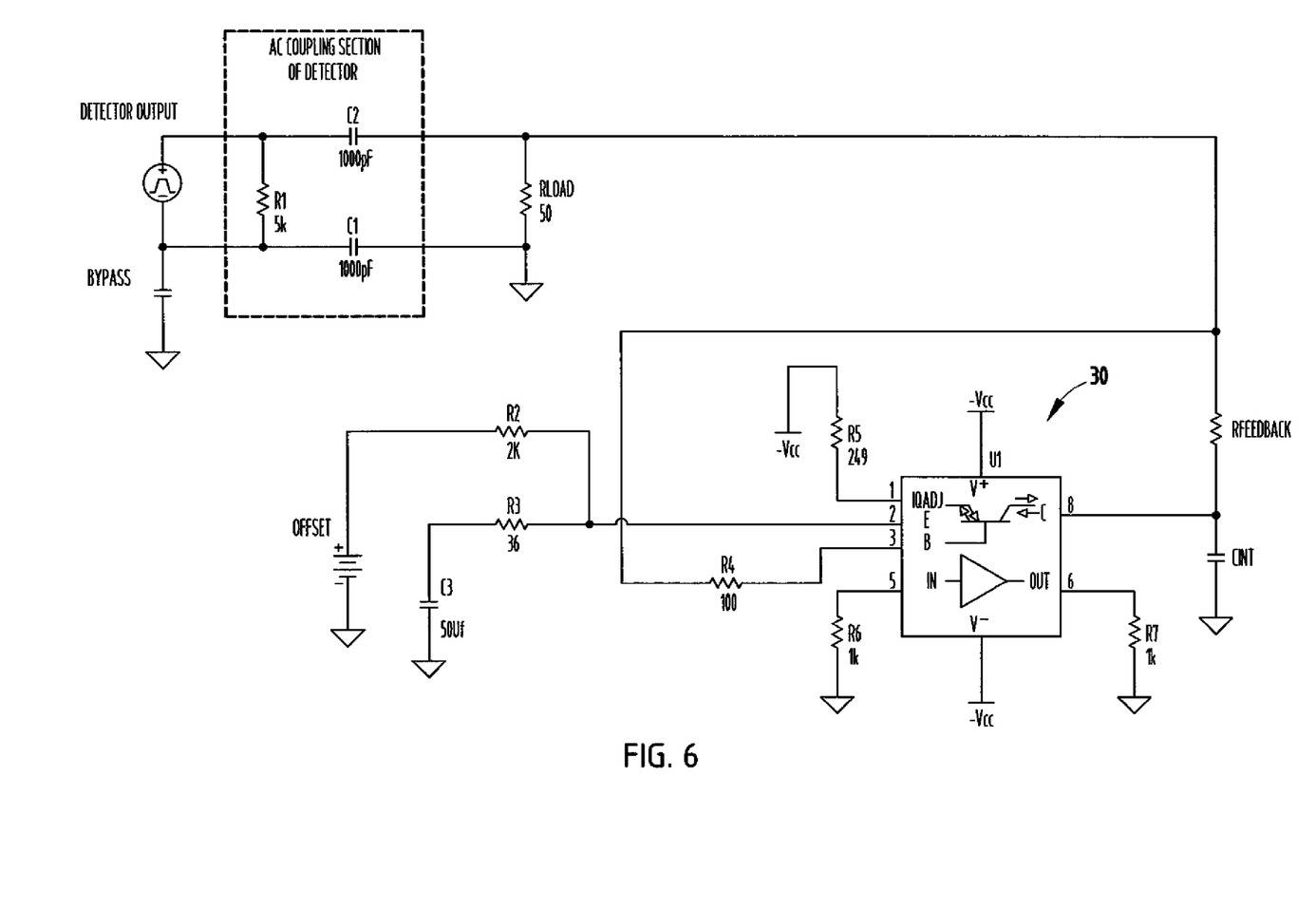

A noise performance improvement to the integrate and inject compensation circuit of FIG. 4 can be made by moving the integration function to after the current source. This allows the noise bandwidth of the circuit to be limited by the integration capacitor. A preferred circuit of this type is illustrated in FIG. 6. In this circuit 30, the compensation circuit is connected to the load termination. Transconductance amplifier U1 creates a current at pin 8 that is proportional to the voltage present at pin 3 divided by the resistance present in the emitter (E) circuit. U1's bias current is controlled by R5 which adjusts the internal emitter resistance. This internal resistance added to R3 represents the resistance seen by the emitter circuit for AC signals. In this case, the total AC emitter resistance is adjusted to be 50 Ohms. The DC emitter resistance is much higher eliminating potential lockup of the circuit due to high DC values. The DC emitter resistance is set by R2. The value of C3 is chosen to not affect performance for the widest pulses and amplitudes that must be base line corrected. In this case, the widest pulse of interest was considered to be the 20 nS FWHH. CINT and RFEEDBACK are chosen to match the time constants created by the AC Coupling section of the detector and RLOAD. For optimum cancellation of the AC coupled detector effect, the time constant of CINT and RFEEDBACK will match that of the AC Coupling section of the detector. In a preferred implementation, either RFEEDBACK or CINT would be an adjustable component to allow the system to be optimized for different detector operating voltages. For instance, a typical installation would have CINT set to about 680 pF and RFEEDBACK set to about 5 k. In this application, the BYPASS capacitor is much larger than C1 making the value of C2 at its operating voltage the deterministic value.

Since the collector current of U1 is equal to the input voltage divided by 50 Ohms (described above), the current in CINT matches the current flowing through C2. The voltage developed across CINT therefore matches the voltage developed across C2 for a given input pulse from the detector. This developed voltage on CINT is feed back to RLOAD and the detector through RFEEDBACK. Since R1 equals RFEEDBACK and the voltages across their associated capacitors are equal, the currents of RFEEDBACK and R1 are equal resulting in no current flow in RLOAD. Both CINT and the C2 will decay in voltage at the same rate since the time constants are equal.

This circuit will add lower frequency noise to the system below the break point set by RFEEDBACK and CINT. In this implementation, added noise would be present below approximately 50 kHz. A variation of this circuit would be to place a large (greater than 100 times CINT) blocking capacitor in series with RFEEDBACK and short C3. This variation allows for lower frequency response but results in higher drift of DC bias points in U1.

EXAMPLE 3

Low Noise Amplifier Base Line Correction

The previous circuits can be added to an existing data collection system to remove the effects of base line shift caused by AC detector coupling. However, both circuits increase the total system noise due to the added active components. Some data collection electronics include a low noise amplifier circuit to boost the signal level to a value adequate for further analysis. Typical noise levels for this type of preamplifier are specified in the range of 1.5 nV/Hz^0.5. To achieve these noise levels, discrete transistor designs are typically utilized that employ feedback techniques to create the desired 50 Ohm input impedance. Feedback is used since a termination resistor of 50 Ohms will have a noise level of 0.9 nV/Hz^0.5.

Figure 7:
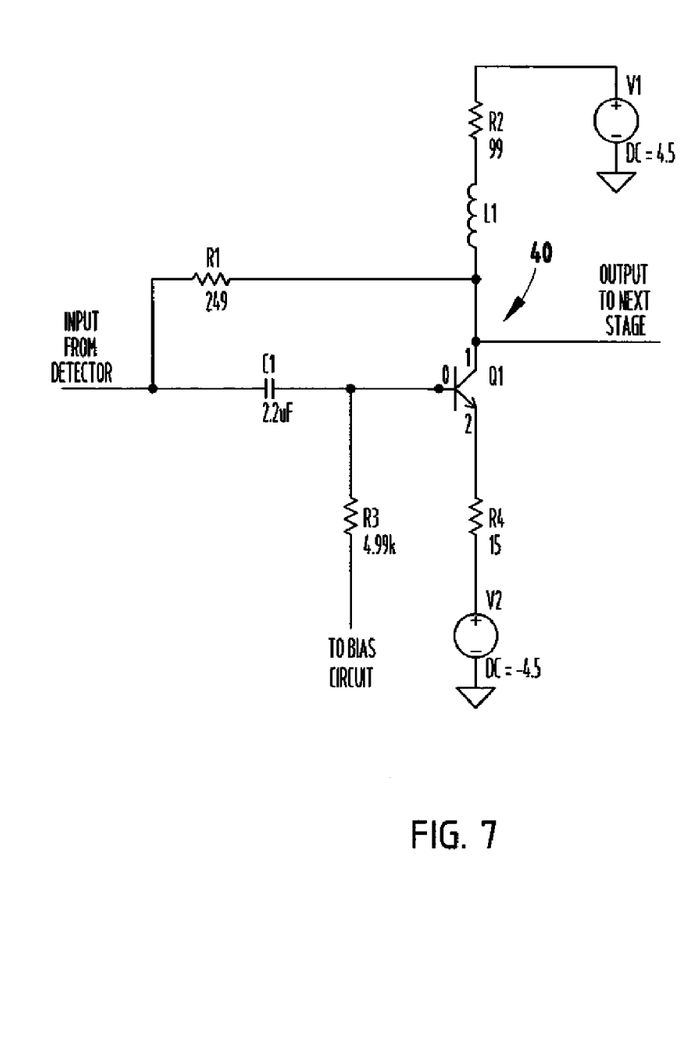

A typical low noise amplifier 40 (FIG. 7) will consist of a low noise RF transistor Q1 which is feed through a large blocking capacitor C1. Feedback is created by R4 in the emitter circuit and R1 in the collector to base circuit. The values shown result in an input impedance of approximately 50 Ohms from 100 Hz through 400 MHz.

Figure 8:
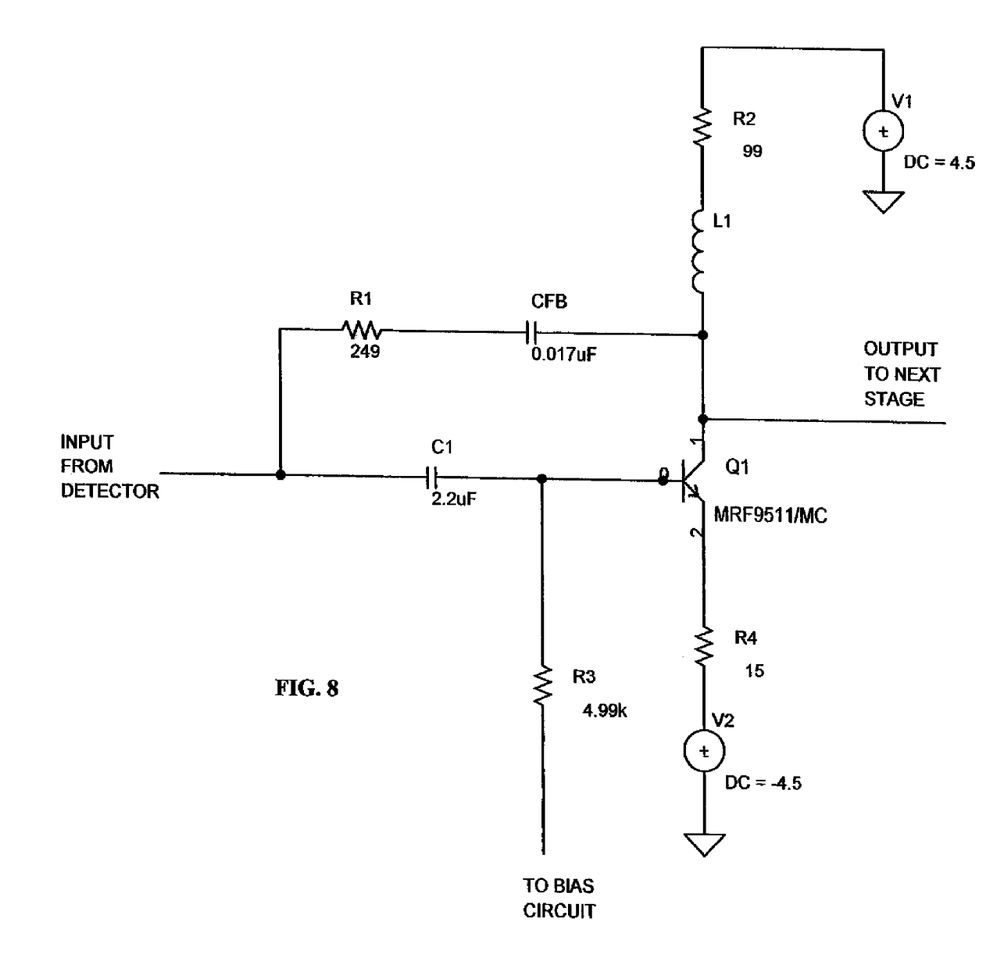

This circuit 40 can be modified, as seen in FIG. 8, by adding a capacitor CFB in series with R1 to increase the gain and input impedance at a desired frequency. Adding capacitor CFB results in increased low frequency gain and a boost in low frequency input impedance that compensates for the voltage developed across the detector coupling capacitors. It should be noted that some amplifiers employ a blocking capacitor like CFB. However, the intent is to optimize the value of CFB for operation with an AC coupled detector. For the same detector utilized previously, it was found a CFB value of 0.017 uF was optimum to restore the base line of pulses less than 20 nS FWHH without increasing amplifier noise levels.

EXAMPLE 4

Typical Low Noise Amplifier with Adjustable Base Line Correction

Figure 9:
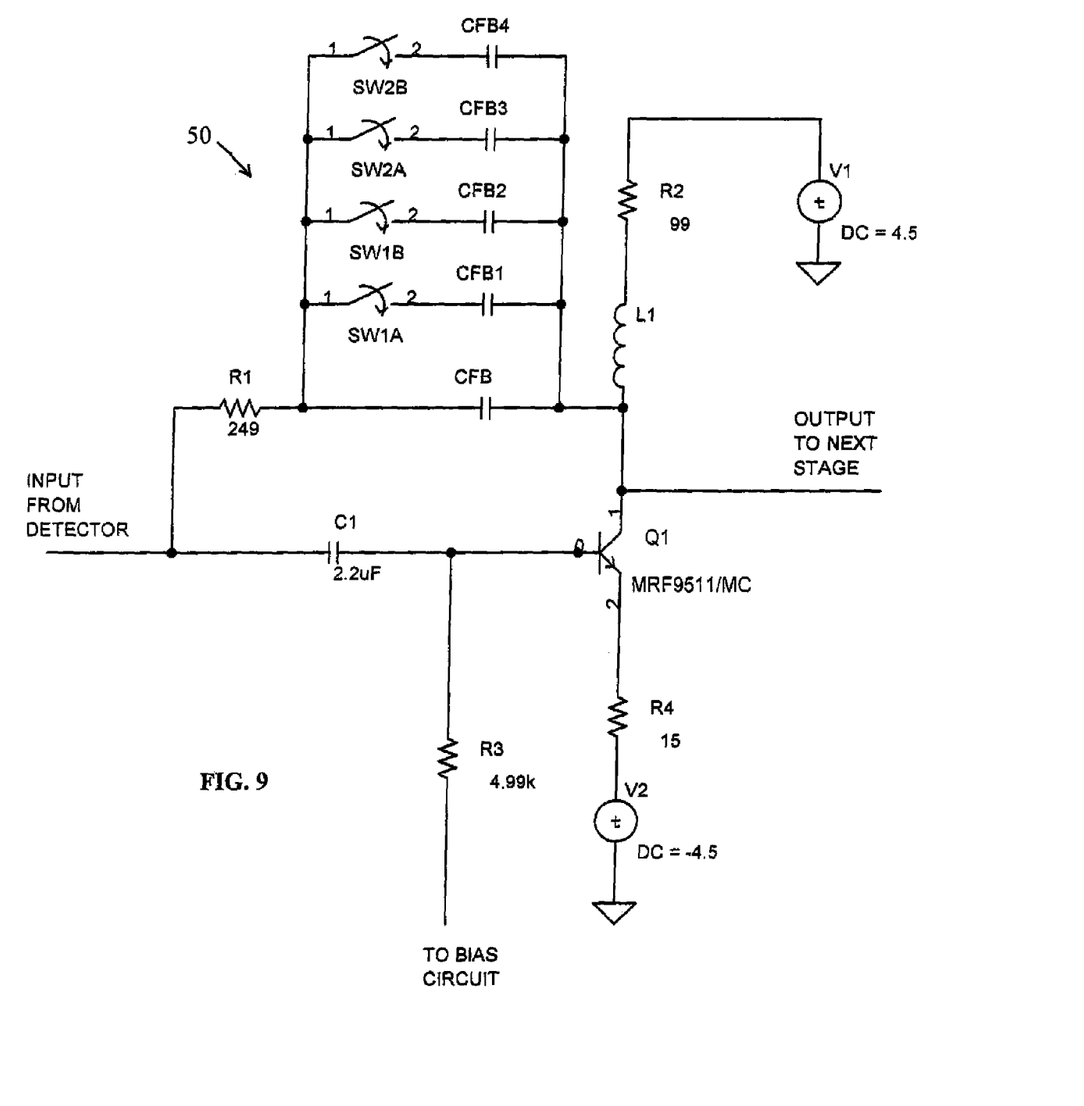

In the preferred implementation, CFB is adjustable through electronic or mechanical means. Adjustments can be made by trimmer capacitors, varactor diodes, switches, or relays appropriate for 400 MHz frequencies. An example of a relay that can be utilized at these frequencies is a TT712-68CSP made by TeraVicta. This relay is a MEMS device capable of 7 GHz performance in a 3.5 mm by 4.6 mm package. Utilizing a pair of TT712-68CSP relays results in 16 possible combinations of compensation values as shown in the circuit 50 of FIG. 9. A typical installation would have the values of CFB in crease by factors of two resulting in binary capacitance selection. For example, if CFB is 0.012 uF, and 4% step sizes are desired, CFB1 would be 500 pF, CFB2 would be 1000 pF, CFB3 would be 2000 pF, and CFB4 would be 4000 pF. The total capacitance range available would be 0.012 uF to 0.0195 uF.

EXAMPLE 5

Operational Amplifier Circuits

Figure 10:
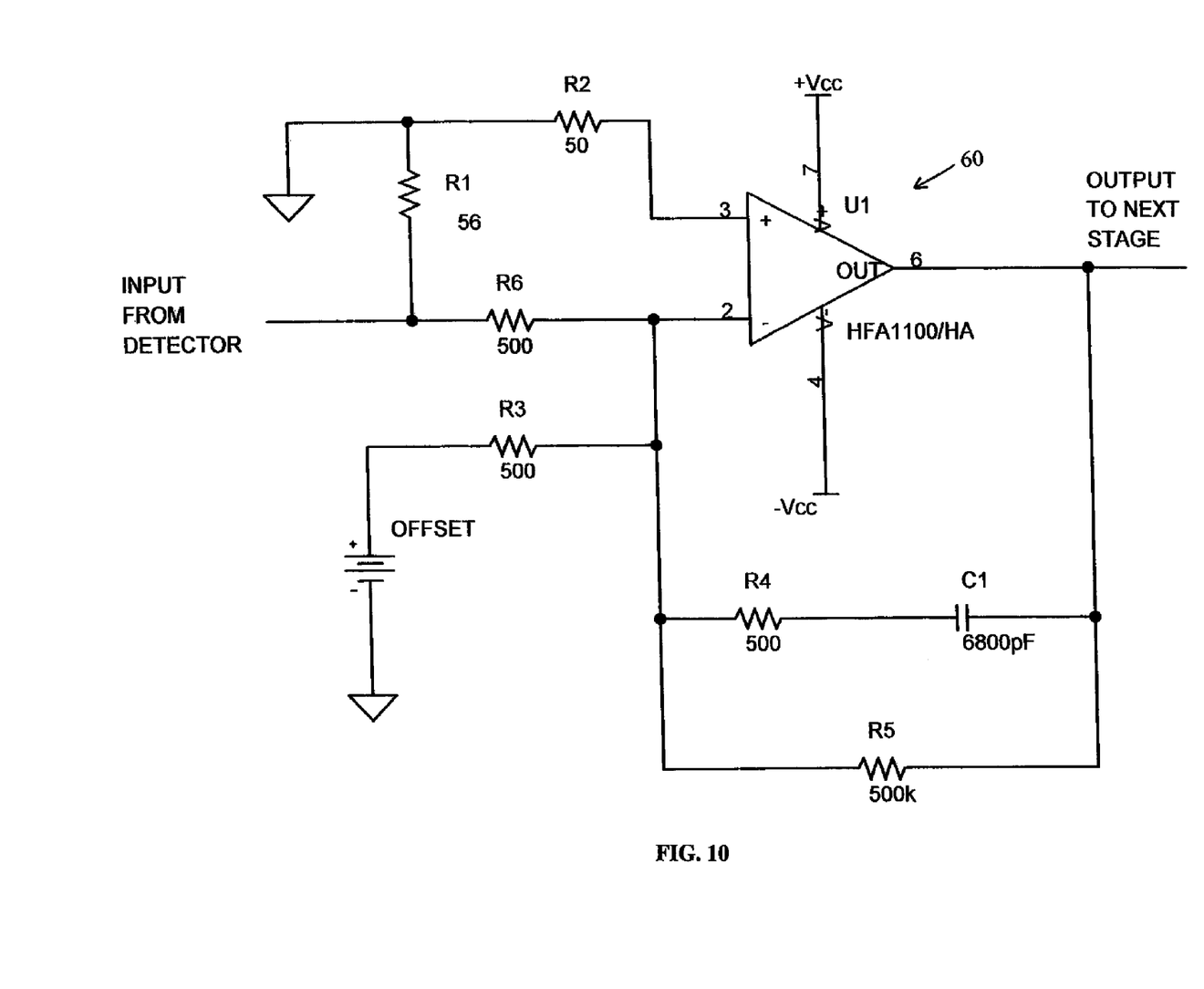

Correction for the base line shift could also be done utilizing operational amplifiers configured as integrators or low frequency boost circuits if noise level is not of primary concern. One possible solution would be to utilize a current feedback amplifier like the Intersil HFA1130 as shown by circuit 60 in FIG. 10. In this design, C1 and R4 have a similar time constant as the detector AC coupling network. R1 and R6 in parallel set the input impedance of the circuit to 50 Ohms.

It will become apparent to those skilled in the art that various modifications to the preferred embodiment of the invention as shown in the above examples and described herein can be made without departing from the spirit or scope of the invention as defined by the appended claims.

The invention claimed is:

1. A base line restoration circuit for correcting shifts in output signals from the coupling circuit of an ion detector of a mass spectrometer comprising:
   a low noise amplifier having an input and an output;
   a feedback network that alters one of the gain and input impedance of said amplifier to result in low frequency base line restoration; and
   a bias circuit coupled to said amplifier for providing, at said output of said amplifier, real time signals which correct the varying instantaneous shifts in signals from the coupling circuit of the ion detector.

2. The circuit of claim 1 and further including a plurality of impedances which are selectively coupled to said amplifier to match the response of said low noise amplifier to that of the coupling circuit of the ion detector to minimize distortion of the base line.

3. The circuit of claim 1 wherein the coupling circuit is associated with an ion detector of a TOFMS.

4. The circuit of claim 1 wherein said amplifier is a single stage transistor amplifier.

5. The circuit of claim 1 wherein said amplifier is an operational amplifier.

6. A time-of-flight mass spectrometer (TOFMS) comprising:
   a sample source including an ionization chamber;
   a flight tube coupled to said ionization chamber for acceleration ions from said source;
   an ion detector coupled to said flight tube;
   a detector coupling circuit coupled to said detector for providing time varying analog signals; and
   a base line restoration circuit coupled to said coupling circuit to correct for low frequency instantaneous base line voltage shifts.

7. The TOFMS as defined in claim 6 wherein said restoration circuit corrects for errors introduced by the AC coupling of signals from said ion detector.

8. The TOFMS as defined in claim 7 wherein said restoration circuit alters the impedance and/or the gain of the system to reduce the effect of the detector AC coupling.

9. The TOFMS as defined in claim 6 wherein said restoration circuit comprises an integrator coupled to a current source to inject current into the signal path from said detector to reduce the detector AC coupling effects.

10. The TOFMS as defined in claim 6 wherein said restoration circuit comprises a current source coupled to an integrator which is coupled to the signal path from said detector to reduce the detector AC coupling effects.

11. The TOFMS as defined in claim 6 wherein said restoration circuit comprises a low noise amplifier employing a feedback network to reduce the detector AC coupling effects.

12. The TOFMS as defined in claim 6 wherein said restoration circuit comprises an operational amplifier employing a feedback network to reduce the detector AC coupling effects.

* * * * *